US006555873B2

(12) United States Patent
Disney et al.

(10) Patent No.: US 6,555,873 B2
(45) Date of Patent: Apr. 29, 2003

(54) HIGH-VOLTAGE LATERAL TRANSISTOR WITH A MULTI-LAYERED EXTENDED DRAIN STRUCTURE

(75) Inventors: Donald Ray Disney, Cupertino, CA (US); Mohamed Darwish, Campbell, CA (US)

(73) Assignee: Power Integrations, Inc., San Jose, CA (US)

( * ) Notice: Subject to any disclaimer, the term of this patent is extended or adjusted under 35 U.S.C. 154(b) by 0 days.

(21) Appl. No.: 09/948,422

(22) Filed: Sep. 7, 2001

(65) Prior Publication Data

US 2003/0047788 A1 Mar. 13, 2003

(51) Int. Cl.[7] .............................................. H01L 29/76
(52) U.S. Cl. ........................ 257/342; 257/335; 257/343; 257/488
(58) Field of Search ................................ 257/335, 342, 257/343, 488, 491

(56) References Cited

U.S. PATENT DOCUMENTS

| | | | |
|---|---|---|---|
| 4,626,879 A | 12/1986 | Colak ........................ 257/336 |
| 4,754,310 A | 6/1988 | Coe ........................... 257/287 |
| 4,764,800 A | 8/1988 | Sander ...................... 257/529 |
| 4,796,070 A | * 1/1989 | Black ........................ 257/328 |
| 4,811,075 A | 3/1989 | Eklund ...................... 257/369 |
| 4,890,146 A | 12/1989 | Williams et al. ........... 257/336 |
| 4,922,327 A | 5/1990 | Mena et al. ............... 257/336 |
| 5,010,024 A | 4/1991 | Allen et al. ................ 438/659 |
| 5,146,298 A | 9/1992 | Eklund ...................... 257/378 |
| 5,155,574 A | 10/1992 | Yamaguchi ................ 257/257 |
| 5,237,193 A | 8/1993 | Williams et al. ........... 257/336 |
| 5,270,264 A | 12/1993 | Andideh et al. ........... 438/703 |
| 5,294,824 A | * 3/1994 | Okada ....................... 257/409 |
| 5,313,082 A | 5/1994 | Eklund ...................... 257/262 |
| 5,324,683 A | 6/1994 | Fitch et al. ................ 438/422 |

(List continued on next page.)

FOREIGN PATENT DOCUMENTS

| | | |
|---|---|---|
| DE | 43 09 764 | 9/1994 |
| WO | WO 99/34449 | 7/1999 |

OTHER PUBLICATIONS

*High Performance 700V Smart Power Technology Based on Thin Layer Silicon–on–Insulator* by Letavic et al. pp. 31–35.
*Theory of Semiconductor Superjunction Devices* by Fujihira, T. Matsumoto Factory, Fuji Electric Co., Ltd. Jul., 1997. Pp. 31–35.

(List continued on next page.)

*Primary Examiner*—George Eckert
(74) *Attorney, Agent, or Firm*—Burgess & Bereznak, LLP

(57) ABSTRACT

A high-voltage transistor with a low specific on-state resistance and that supports high voltage in the off-state includes one or more source regions disposed adjacent to a multi-layered extended drain structure which comprises extended drift regions separated from field plate members by one or more dielectric layers. With the field plate members at the lowest circuit potential, the transistor supports high voltages applied to the drain in the off-state. The layered structure may be fabricated in a variety of orientations. A MOSFET structure may be incorporated into the device adjacent to the source region, or, alternatively, the MOSFET structure may be omitted to produce a high-voltage transistor structure having a stand-alone drift region.

56 Claims, 9 Drawing Sheets

U.S. PATENT DOCUMENTS

| | | | | |
|---|---|---|---|---|
| 5,359,221 A | | 10/1994 | Miyamoto et al. | 257/408 |
| 5,386,136 A | | 1/1995 | Williams et al. | 257/409 |
| 5,438,215 A | | 8/1995 | Tihanyi | 257/401 |
| 5,473,180 A | * | 12/1995 | Ludikhuize | 257/336 |
| 5,521,105 A | | 5/1996 | Hsu et al. | 438/197 |
| 5,550,405 A | | 8/1996 | Cheung et al. | 257/642 |
| 5,637,898 A | | 6/1997 | Baliga | 257/330 |
| 5,654,206 A | | 8/1997 | Merrill | 438/15 |
| 5,656,543 A | | 8/1997 | Chung | 438/625 |
| 5,659,201 A | | 8/1997 | Wollesen | 257/758 |
| 5,663,599 A | | 9/1997 | Lur | 257/750 |
| 5,670,828 A | | 9/1997 | Cheung et al. | 257/773 |
| 5,679,608 A | | 10/1997 | Cheung et al. | 438/622 |
| 5,998,833 A | | 12/1999 | Giese et al. | 362/287 |
| 6,133,607 A | * | 10/2000 | Funaki et al. | 257/343 |
| 6,184,555 B1 | | 2/2001 | Tihanyi et al. | 257/342 |
| 6,353,252 B1 | * | 3/2002 | Yasuhara et al. | 257/487 |

OTHER PUBLICATIONS

Yung C. Liang, K.P. Gan and Ganesh S. Sumudra; Oxide–Bypassed VDMOS (OBVDMOS): An Alternative to Superjunction High Voltage MOS Power Devices; Article dated Aug. 8, 2001, IEEE Electron Devices Letters, vol. 22, No. 8, pp. 407–409.

*International Electron Devices Meeting 1979—Washington, D.C. Dec. 3–4–5,* Sponsored by Electron Devices Society of IEEE, pp. 238–241.

*Japanese Journal of Applied Physics, Part 1, Regular Papers, Short Notes & Review Papers,* Oct. 1997; vol. 36, No. 10; pp. 6254–6262.

Patent Abstract of Japan, vol. 018, No. 590 (E–1628), Nov. 10, 1994 and JP 06224426 (Matsushita Electron Corp.) Aug. 12, 1994.

Patent Abstract of Japan, vol. 016, No. 347 (E–1240), Jul. 27, 1992 and JP 04 107867 (Matsushita Electron Corp.) Apr. 9, 1992.

*Air–Gap Formation During IMD Deposition to Lower Interconnect Capacitance,* B Shieh, K.C. Saraswat, IEEE Electron Device Letters, vol., 19, No. 1, Jan. 1998.

*Theory of Semiconductor Superjunction Devices,* Tatsuhiko Fujihara; Received Mar. 11, 1997; accepted for publication Jul. 23, 1997, 9 pages.

*A New Generation of High Voltage MOSFETs Breaks The Limit Line of Silicon,* G. Deboy, M. Marz, J.–P. Stengl, H. Strack, J. Tihanyi and H. Weber, Siemens AG, Semiconductor Division, Munchen, Germany; IEDM 98–683—IEDM 98–685.

*Realization of High Breakdown Voltage (>700V) in Thin SOI Devices;* S. Merchant, E. Arnold, H. Baumgart, S. Mukherjee, H. Pein, and R. Pinker, Philips Laboratories, North American Philips Corporation; 1991 IEEE, pp. 31–35.

*High Performance 600 V Smart Power Technology Based on Thin Layer Silicon–on–Insulator;* T. Letavic, E. Arnold, M. Simpson, R. Aquino, H. Ghimnathwala, R. Egloff, A. Emmerik, S. Wong, S Mukherjee, Philips Research, Philips Electronics North American Corporation, 4 pages.

* cited by examiner

HIGH-VOLTAGE LATERAL TRANSISTOR WITH A MULTI-LAYERED EXTENDED DRAIN STRUCTURE

RELATED APPLICATIONS

This application is related to co-pending applications: Ser. No. 09/948,879, filed Sep. 7, 2001, entitled, "METHOD OF FABRICATING A HIGH-VOLTAGE TRANSISTOR WITH A MULTI-LAYERED EXTENDED DRAIN STRUCTURE", and Ser. No. 09/948,930, filed Sep. 7, 2001, entitled, "HIGH-VOLTAGE VERTICAL TRANSISTOR WITH A MULTI-LAYERED EXTENDED DRAIN STRUCTURE", both of which are assigned to the assignee of the present application.

FIELD OF THE INVENTION

The present invention relates to semiconductor devices fabricated in a silicon substrate. More specifically, the present invention relates to field-effect semiconductor transistor structures capable of withstanding high voltages.

BACKGROUND OF THE INVENTION

High-voltage, field-effect transistors (HVFETs) are well known in the semiconductor arts. Most often, HVFETs comprise a device structure that includes an extended drain region that supports the applied high-voltage when the device is in the "off" state. HVFETs of this type are commonly used in power conversion applications such as AC/DC converters for offline power supplies, motor controls, and so on. These devices can be switched at high voltages and achieve a high blocking voltage in the off state while minimizing the resistance to current flow in the "on" state. The blocking or breakdown voltage is generally denoted as Vbd. The acronym Rsp refers to the product of the resistance and surface area, and is generally used to describe the on-state performance of the device. An example of a prior art HVFET having an extended drain region with a top layer of a conductivity type opposite that of the extended drain region is found in U.S. Pat. No. 4,811,075.

In a conventional HVFET the extended drain region is usually lightly doped to support high voltages applied to the drain when the device is off. The length of the extended drain region is also increased to spread the electric field over a larger area so the device can sustain higher voltages. However, when the device is on (i.e., conducting) current flows through the extended drain region. The combined decrease in doping and increase length of the extended drain region therefore have the deleterious effect on the on-state performance of the device, as both cause an increase in on-state resistance. In other words, conventional high-voltage FET designs are characterized by a trade-off between Vbd and Rsp.

To provide a quantitative example, a typical prior art vertical HVFET (NMOS-type) may have a Vbd of 600V with a Rsp of about 16 ohm-mm$^2$. Increasing the length of the extended drain would affect device performance by increasing Vbd beyond 600V at the expense of a higher Rsp value. Conversely, reducing the length of the extended drain would improve the on-state resistance to a value below 16 ohm-mm$^2$, but such a change in the device structure would also cause Vbd to be reduced to less than 600V.

A device structure for supporting higher Vbd voltages with a low Rsp value is disclosed in U.S. Pat. Nos. 4,754,310, 5,438,215, and also in the article entitled, *"Theory of Semiconductor Superjunction Devices"* by T. Fujihira, Jpn. J. Appl. Phys., Vol. 36, pp. 6254–6262, October 1977. In this device structure the extended drain region comprises alternating layers of semiconductor material having opposite conductivity types, e.g., PNPNP . . . As high voltage is applied to the layers of one conductivity type, all of the layers are mutually depleted of charge carriers. This permits a high Vbd at much higher conducting layer doping concentrations as compared to single layer devices. The higher doping concentrations, of course, advantageously lower the Rsp of the transistor device. For example, in the article entitled, *"A new generation of high voltage MOSFETs breaks the limit line of silicon"* by G. Deboy et al., IEDM tech. Digest, pp. 683–685, 1998, the authors report a vertical NMOS device with a Vbd of 600V and a Rsp of about 4 ohm-mm$^2$.

Another approach to the problem of achieving high-voltage capability is disclosed in the paper, *"Realization of High Breakdown Voltage in Thin SOI Devices"* by S. Merchant et al., Proc. Intl. Symp. on Power Devices and ICs, pp. 31–35, 1991. This paper teaches an extended drain region that comprises a thin layer of silicon situated on top of a buried oxide layer disposed on top of a semiconductor substrate. In operation, the underlying silicon substrate depletes charge from the thin silicon layer at high voltages. The authors claim that high values of Vbd are obtained as long as the top silicon layer is sufficiently thin and the buried oxide layer is sufficiently thick. For instance, a lateral NMOS device with Vbd of 600V and Rsp of about 8 ohm-mm$^2$ is obtained using this approach.

Other background references of possible interest to those skilled in the art include U.S. Pat. No. 6,184,555, 6,191,447, 6,075,259, 5,998,833, 5,637,898, International Application No. PCT/IB98/02060 (International Publication No. WO 99/34449), and the article, *"High Performance 600V Smart Power Technology Based on Thin Layer Silicon-on-Insulator"* by T. Letavic et al., Proc. ISPSD, pp. 49–52, 1997.

Although the device structures described above achieve high Vbd with relatively low on-state resistance as compared to earlier designs, there is still an unsatisfied need for a high-voltage transistor structure that can support still higher voltages while achieving a much lower on-state resistance.

BRIEF DESCRIPTION OF THE DRAWINGS

The present invention is illustrated by way of example, and not limitation, in the figures of the accompanying drawings, wherein.

DETAILED DESCRIPTION

A high-voltage field-effect transistor having an extended drain region and a method for making the same is described. The HVFET has a low specific on-state resistance and supports high voltage in the off-state. In the following description, numerous specific details are set forth, such as material types, doping levels, structural features, processing steps, etc., in order to provide a thorough understanding of the present invention. Practitioners having ordinary skill in the semiconductor arts will understand that the invention may be practiced without many of these details. In other instances, well-known elements, techniques, and processing steps have not been described in detail to avoid obscuring the invention.

Figure 1:
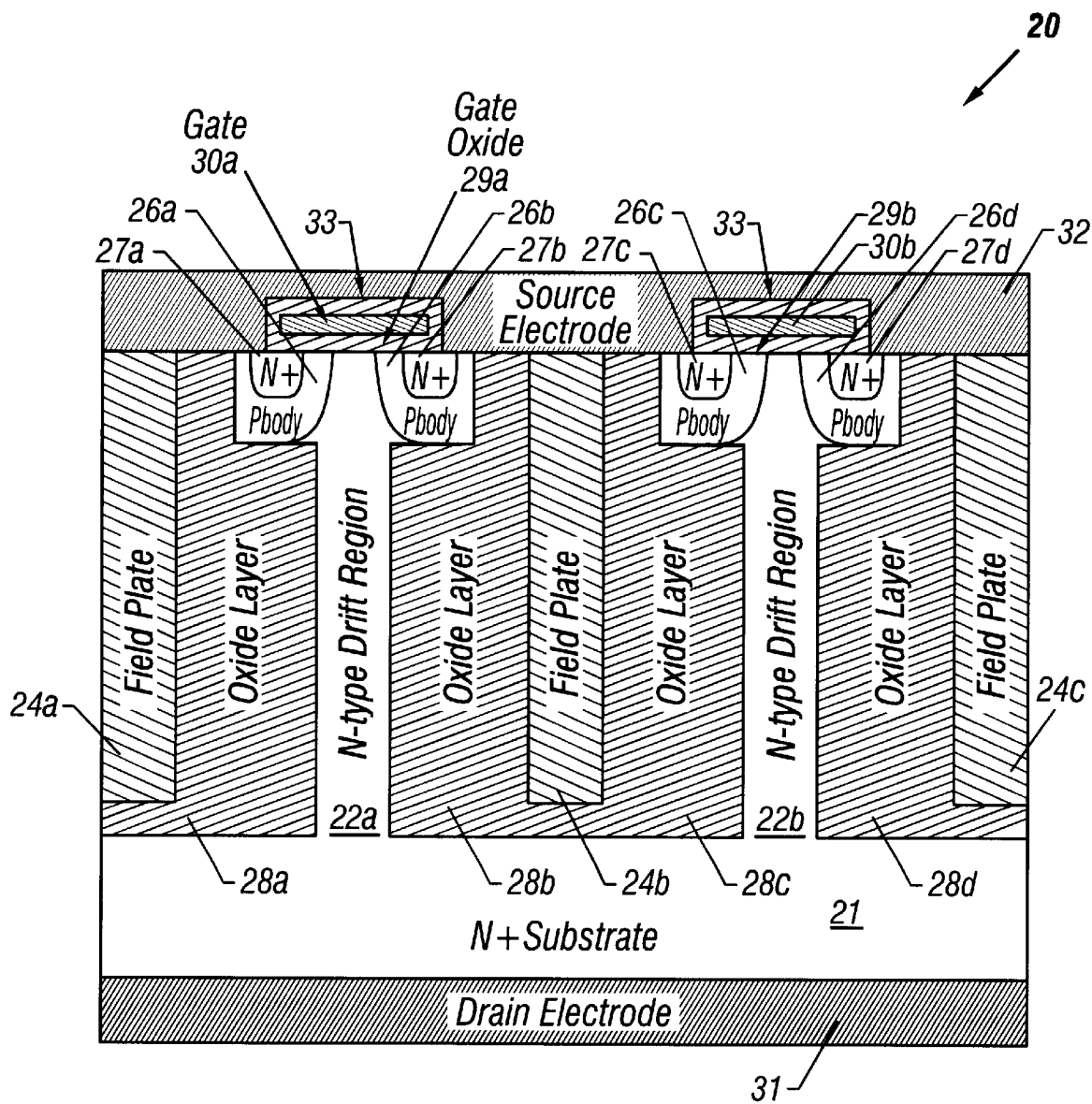
FIG. 1 is a cross-sectional side view of a vertical high-voltage, field-effect transistor (HVFET) device structure in accordance with one embodiment of the present invention.

FIG. 1 is a cross-sectional side view of a vertical n-channel (i.e., NMOS) HVFET 20 in accordance with one embodiment of the present invention. It should be understood that the elements in the figures are representational, and are not drawn to scale in the interest of clarity. It is also appreciated that a p-channel transistor may be realized by utilizing the opposite conductivity types for all of the illustrated diffusion/doped regions. Furthermore, although the figure appears to show two separate devices, those of skill will understand that such transistor structures are commonly fabricated in an annular, inter-digitated, or otherwise replicated manner.

The device structure of FIG. 1 includes an insulated-gate, field-effect transistor (IGFET) having a gate 30 (comprised, for example, of polysilicon), and a gate-insulating layer 29 that insulates gate 30 from the underlying semiconductor regions. Gate-insulating layer 29 may comprise ordinary silicon dioxide or another appropriate dielectric insulating material. The extended drain region of vertical HVFET 20 comprises two or more parallel N-type drift regions 22 situated between p-type body regions 26 and extending down to the N+substrate 21. For instance, FIG. 1 shows drift region 22a extending from beneath gate oxide 29a between P-body regions 26a & 26b down to N+ substrate 21. Similarly, drift region 22b extends from gate oxide 29b between P-body regions 26c & 26d down to N+ substrate 21.

Source electrode 32 is electrically connected to N+source regions 27, which are disposed in respective P-body regions 26. For example, N+ source region 27a is disposed in P-body region 26a; N+ region 27b is disposed in P-body region 27b, and so on. It is appreciated that a variety of alternative source electrode connections are also possible. The area of the P-body regions directly beneath gate 30 (between N+ source regions 27 and drift regions 22) comprises the IGFET channel region of the transistor. In this particular embodiment, the gate region is a metal-oxide semiconductor (MOS), and the IGFET is a NMOS transistor. Thus, the channel regions of HVFET 20 are defined at one end by N+ source regions 27 and at the other end by N-type drift regions 22, which extend vertically from gate-oxide 29 down to the N+ substrate 21. Insulating layers 33 separate gate 30 from source electrode 32. The drift regions define a path for current flow, herein referred to as the first direction.

The n-type drift regions 22 are separated laterally by insulating regions or dielectric layers 28. This direction of separation is substantially orthogonal to the first direction and is herein referred to as the second direction. In the embodiment of FIG. 1, dielectric layers 28 extend vertically from beneath P-body regions 26 down to N+ substrate 21 along the full vertical length of the drift regions 22. By way of example, dielectric layers 28 may comprise silicon dioxide, but other insulating materials, such as silicon nitride, may also be used. Disposed within each of the dielectric layers 28, and fully insulated from the semiconductor substrate 21 and drift regions 22, is a field plate member 24. Field plate members 24 comprise a conducting layer of material such as heavily doped polysilicon, metal, metal alloys, etc. As shown in the embodiment of FIG. 1, each of the field plate members 24 is electrically connected to source electrode 32. Alternatively, the field plate members may be connected to a separate electrode. Gates 30 are also connected to a separate electrode (not shown). Drain electrode 31 provides electrical connection to the bottom of N+ substrate 21.

The extended drain region of vertical NMOS high-voltage transistor 20 of FIG. 1 consists of a plurality of laterally interleaved layers of doped semiconductor material (e.g., n-type drift regions 22), insulating material (e.g., silicon dioxide dielectric layer 28), and conducting material (e.g., heavily-doped polysilicon). In the on state, a sufficient voltage is applied to the gate such that a channel of electrons is formed along the surface of the P-body regions 26. This provides a path in the first direction for electron current flow from source electrode 32, N+ source regions 27, through the channel regions formed in P-body regions 26, down through the N-type drift regions 22, through the N+ substrate 21, to drain electrode 31.

Practitioners in the semiconductor arts will note that in a conventional vertical HVNMOS transistor, the N-type drift region is normally very thick (i.e., long) and lightly doped; both of which contribute to high on state resistance. In the device structure of FIG. 1, on the other hand, the doping in the N-type drift regions may be considerably higher, such that the on-state resistance is dramatically lowered. Lowering the on-state resistance is achieved in HVFET 20 by the use of multiple, parallel-arranged extended drain or drift regions.

In the off state, a high voltage (e.g., 200V–1200V) is applied across the respective drain and source electrodes 31 and 32. As the voltage increases, the presence of field plate regions 24 on opposite sides of drift regions 22 cause the N-type drift regions to become depleted of free carriers. Ideally, the doping profile in the drift regions 22 is tailored such that the resulting electric field is approximately constant along the path from the drain to the source. For example, the doping concentration may be highest near the N+substrate 21, lowest the near the P-body regions 26, and linearly graded in between.

The thickness of both the N-type drift regions 22 and oxide layers 28 should be designed so as to guard against premature avalanche breakdown. Avalanche breakdown can be avoided by making the drift region relatively narrow in the second direction, which reduces the ionization path and thereby increases the critical electric field at which avalanche occurs. In the same regard, making oxide layers 28 relatively wide in the second direction allows the device structure to support a larger voltage for a given critical electric field.

By way of example, a device manufactured in accordance with FIG. 1 having a drift region that is about 50 um high and about 0.4–0.8 um wide, with an oxide layer width in the approximate range of 3.0–4.0 um is capable of supporting about 800V. In such a device, the doping in the drift region may be linearly graded from about $5 \times 10^{15}$ cm$^{-3}$ near the P-body regions to about $1 \times 10^{17}$ cm$^{-3}$ near the N+ substrate. The on-state resistance of such a device is about 1.0 ohm-mm$^2$.

Practitioners in the art will appreciate that the device performance for HVFET 20 may be improved when manufactured as a smaller total cell pitch (i.e., combined width of field plate, oxide layer and drift regions) because the contribution of each drift region is fairly constant.

Figure 2:
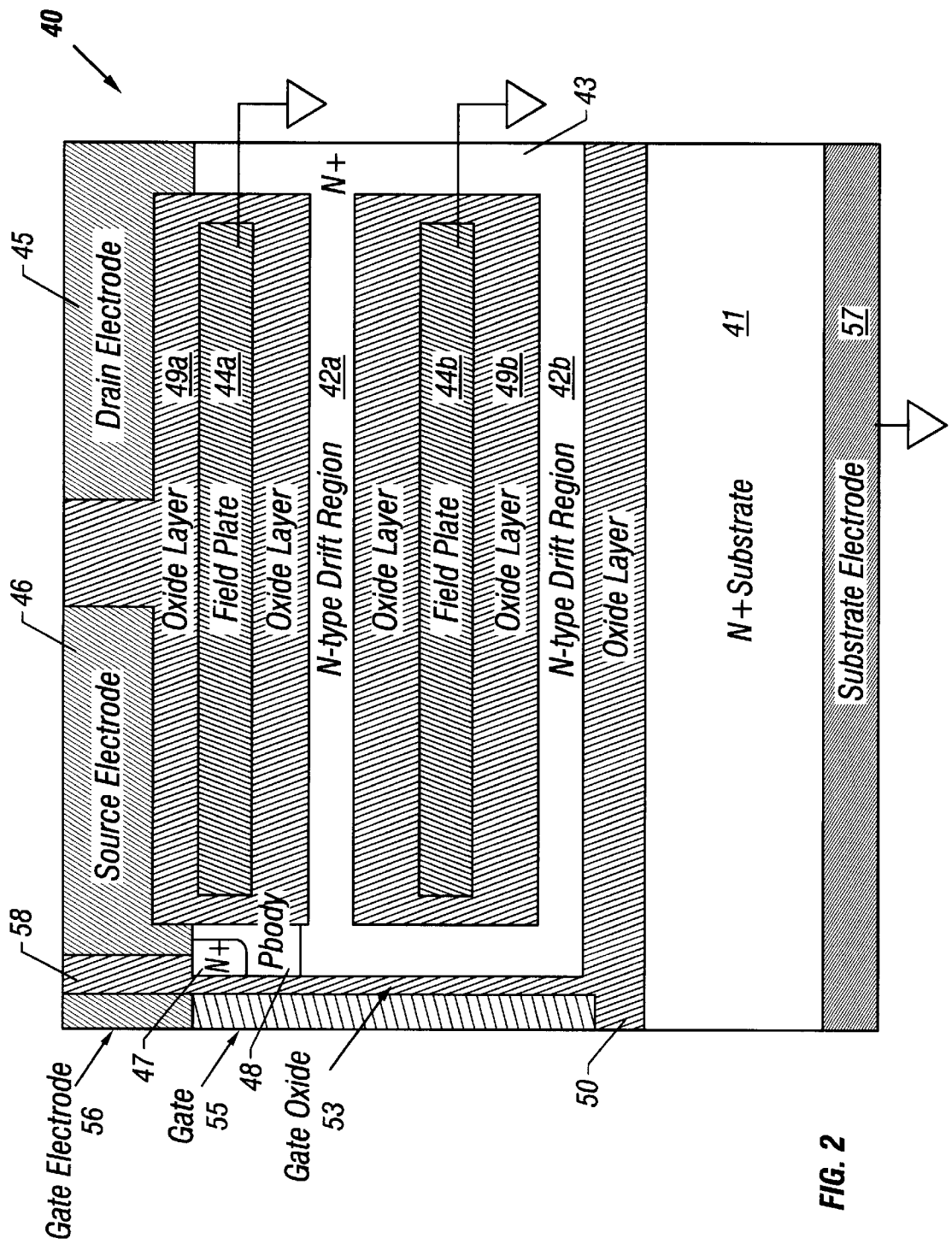
FIG. 2 is a cross-sectional side view of one embodiment of a lateral HVFET fabricated in accordance with the present invention.

Referring now to FIG. 2, there is shown a lateral NMOS high-voltage transistor 40 in accordance with another embodiment of the present invention. HVFET 40 of FIG. 2 operates according to the same principles discussed in connection with the transistor structure of FIG. 1, except that current flows laterally, as opposed to vertically, through the drift regions. Note that in the embodiment of FIG. 2, field plate members 44 are fully insulated from the semiconductor material by oxide layers 49.

In this example, field plate member 44a is disposed within oxide layer 49a just below the source and drain electrodes 46 and 45, respectively. Field plate member 44b is disposed within oxide layer 49b below N-type drift region 42a and above N-type drift region 42b. The field plate members may be connected to a field plate electrode at a certain location out of the plane of the figure. The N-type drift region, which comprises the extended drain of the transistor, extends laterally from beneath P-body region 48 across to N+ drain region 43. N+ drain region 43 connects both drift regions 42a & 42b with drain electrode 45.

An N+ source region 47, which is electrically connected to source electrode 46, is disposed adjacent P-body region 48. The HVFET 40 utilizes a vertical MOS gate structure 12 that comprises a gate electrode 56 that connects to gate 55. In this embodiment, gate 55 comprises a layer of polysilicon that extends vertically from gate electrode 56. Gate 55 extends below the P-body region, and may extend down to oxide layer 50, as shown. Gate 55 is insulated from N+ source region 47, P-body region 48, and N-type drift region 42 by gate oxide 53. An oxide region 58 separates gate electrode 56 from source electrode 46.

Oxide layer 50 insulates N+ substrate 41 from gate 55, N-type drift region 42, and N+ drain region 43. As can be seen, oxide layer 50 extends laterally over N+ substrate 41 beneath each of the regions 42, 43, and 55. Substrate electrode 57 provides electrical connection to the bottom of N+ substrate 41. The substrate may serve as the bottom field plate for drift region 42b.

The on-state and off-state operations of HVFET 40 are similar to those described for the embodiment of FIG. 1. In this case, however, the source and drain electrodes are located on the top surface. This means that electrons flows down through N+ source region 47, across the channel region formed in P-body region 48 adjacent to gate oxide 53, laterally across the N-type drift regions 42, and up through the N+ drain region 43 before reaching the drain electrode.

Note that even though FIG. 2 shows a trench gate structure, planar gate structures could also be used. Additionally, a trench drain structure could also be used in an alternative implementation. Furthermore, although the embodiment of FIG. 2 shows the extended drain region comprising two laterally extending, parallel N-type drift regions 42a and 42b, other embodiments may utilize more than two parallel drift regions. In other words, the embodiment of FIG. 2 is not limited to just two drift regions, but could include any number of layers of drift, oxide, and field plate regions within manufacturing limits.

Figure 3A:
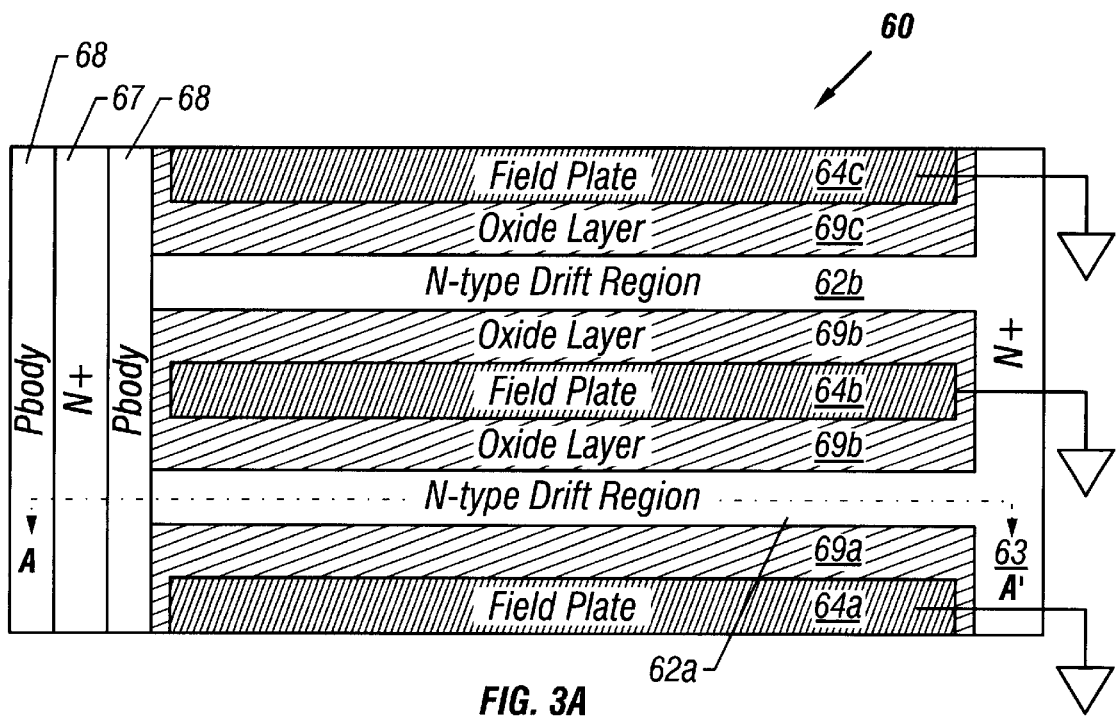
FIG. 3A is a top view of lateral HVFET fabricated in accordance with another embodiment of the present invention.
Figure 3B:
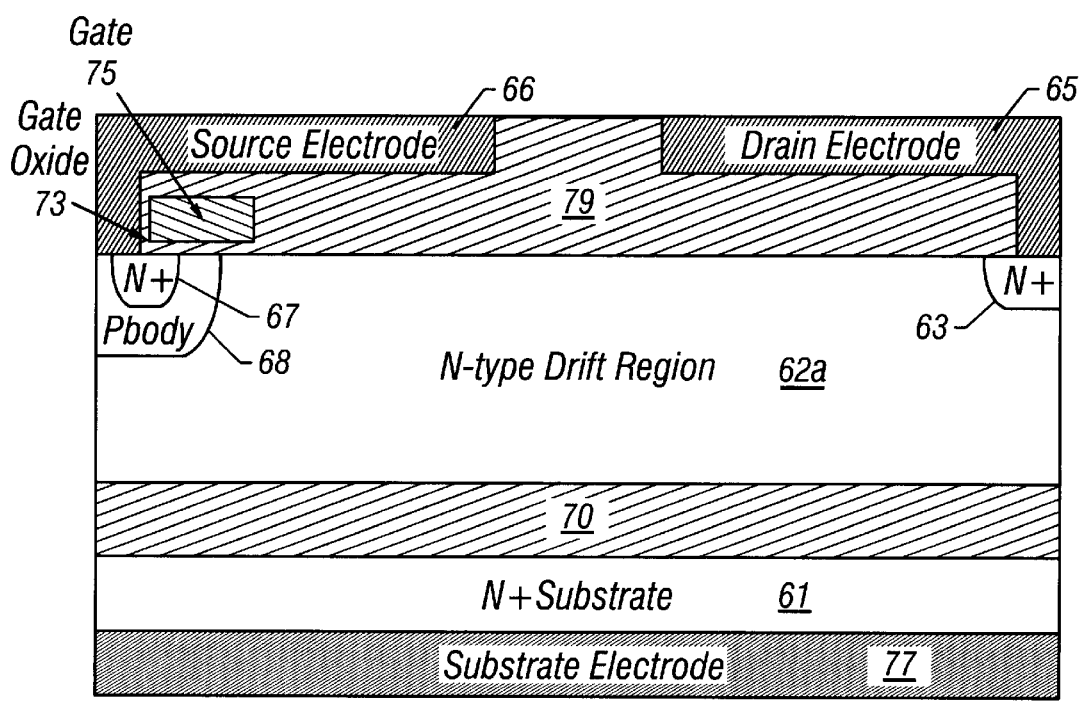
FIG. 3B is a cross-sectional side view of the lateral HVFET shown in FIG. 3A, taken along cut lines A–A'.

FIGS. 3A & 3B illustrate another embodiment of a lateral HVFET in accordance with the present invention. FIG. 3A is a top view of a lateral HVNMOS transistor 60, and FIG. 3B is a cross-sectional side view of the same device, taken along cut lines A–A', which extends through drift region 62a. (Note that the source electrode 66, drain electrode 65, gate 75, gate oxide 73 and oxide layer 79 are not depicted in FIG. 3A to avoid confusion. These elements are shown in the cross-sectional side view of FIG. 3B.)

The lateral device structure of FIG. 3 is similar to that shown in FIG. 2. But rather than orient the drift, oxide, and field plate layered regions on top of one another (vertically), the embodiment of FIG. 3 has these regions oriented side-by-side. Unlike the embodiment of FIG. 2, each of the N-type drift regions 62, oxide layers 69, and field plate members 64 extend from underlying insulating layer 70 toward the upper substrate surface. Each of the N-type drift regions 62 and field plate members 64 are insulated from N+ substrate 61 by insulating layer 70. In one embodiment, layer 70 comprises silicon dioxide. An additional electrode 77 provides electrical connection to the bottom of N+ substrate 61.

The planar gate and drain configurations of HVNMOS transistor 60 are illustrated in the side view of FIG. 3B. Alternatively, a trench drain structure and/or a trench gate structure may be utilized. In this embodiment, a gate member 75 is disposed above P-body region 68 and is insulated from the semiconductor substrate by a gate oxide 73. Source electrode 66 contacts N+ source region 67, which is disposed in P-body region 68. P-body region 68 is itself shown disposed in N-type drift region 62.

N+ drain region 63 is disposed at the opposite end of the N-type drift region 62 and is electrically connected to drain electrode 65.

The embodiments of FIGS. 2 and 3 show the field plate members being coupled to the lowest chip potential, e.g., ground. The source may be tied to the field plate members (at the lowest chip potential), or, alternatively, the source region may be left floating. In other words, the embodiments of FIGS. 1–3 are not limited to a source follower configuration. Each of the transistor structures of the present invention may be implemented as a four-terminal device, wherein the drain, source, field plate members, and insulated gate members are connected to a separate circuit terminal. In another embodiment, the field plate and insulated gate members may be connected together.

Figure 4:
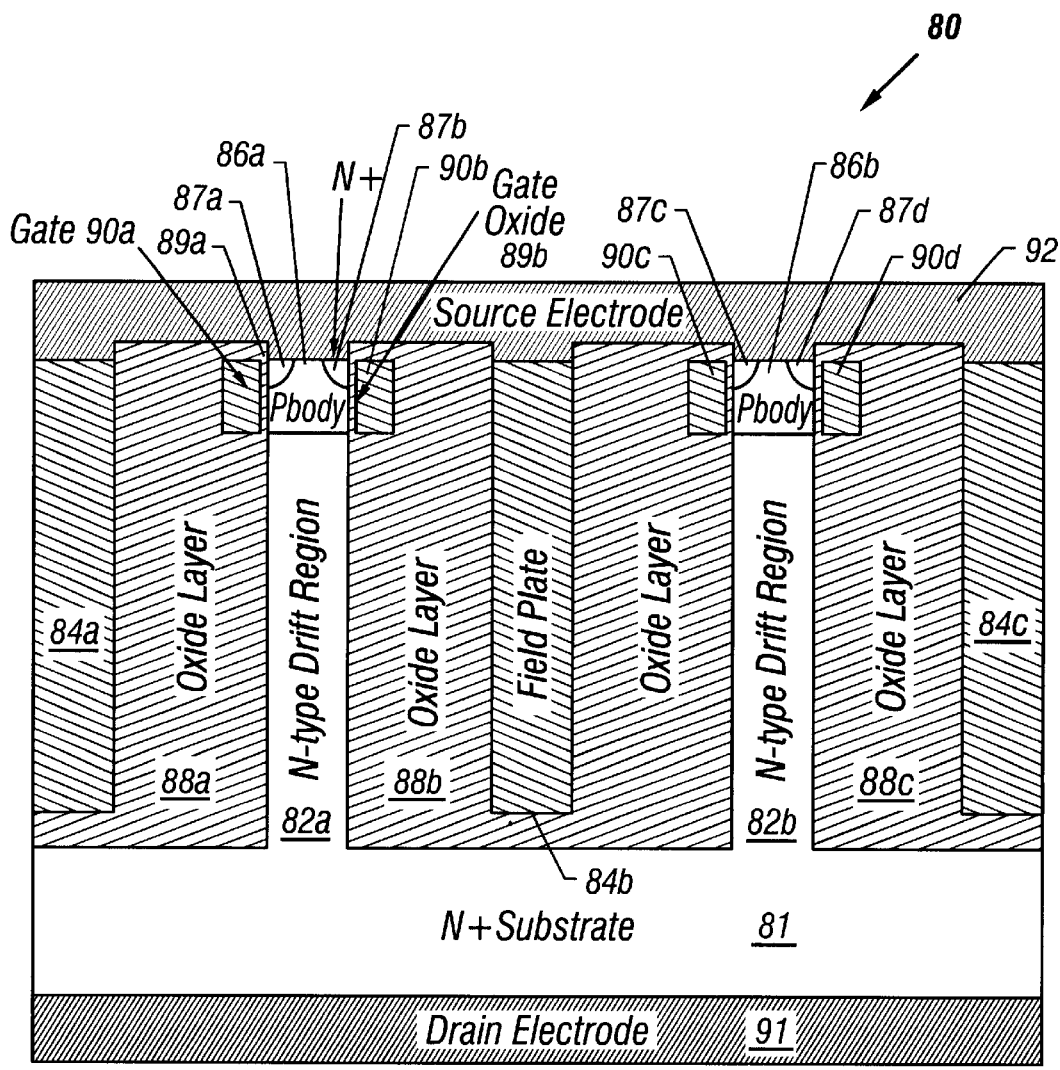
FIG. 4 is a cross-sectional side view of another embodiment of a vertical HVFET device structure fabricated according to the present invention.

With reference now to FIG. 4, there is shown a cross-sectional side view of another embodiment of a vertical HVNMOS transistor 80 constructed according to the present invention. The device structure shown in FIG. 4 is similar to that of FIG. 1, except that the planar gate has been replaced by a trench gate structure. As in the vertical device structure of FIG. 1, transistor 80 comprises a plurality of parallel-arranged N-type drift regions 82 that extend vertically from P-body regions 86 down to the N+ substrate 81. Each of the drift regions 82 is adjoined on both sides by an oxide layer 88. For example, N-type drift region 82a is bounded on one side by oxide layer 88a and on the opposite side by oxide layer 88b.

Disposed within each of the oxide layers 88, and fully insulated from the drift region and substrate semiconductor materials, is a field plate member 84 that may be electrically connected to source electrode 92. The N-type drift regions 82, oxide layers 88, and field plate members 84 collectively comprise a parallel layered structure that extends in a lateral direction, which is perpendicular to the direction of current flow in the on-state. When transistor 80 is in the on-state, current flows vertically from the drain electrode 91 through the parallel N-type drift regions 82, through the MOS channel formed on the sidewalls of the P-body region, to the source electrode 92.

The trench gate structure of vertical HVNMOS transistor 80 comprises gate members 90 disposed between field plate members 84 and P-body regions 86. In the embodiment of FIG. 4, a pair of N+ source regions 87 is disposed in each of P-body regions 86 on opposite sides. Each P-body region 86 is located at one end of a corresponding N-type drift region 82. A thin gate-insulating layer 89 (e.g., oxide) insulates each of gate members 90 (e.g., polysilicon) from the P-body semiconductor material.

For example, FIG. 4 shows gate members 90a & 90b disposed along opposite sides of P-body region 86a. N+ source regions 87a & 87b are disposed in P-body region 86a at opposite sides adjacent to the gate members; both regions 87a & 87b are electrically connected to source electrode 92. P-body region 86a adjoins the source electrode at one end and drift region 82a at the other end. When transistor 80 is in the on-state conducting channel regions are formed along the sides of P-body region 86a such that current flows from source electrode 92, through N+ regions 87, across P-body 86, down through N-type drift regions 82 and N+substrate 81, to drain electrode 91.

Practitioners in the art will appreciate that the pair of N+ source regions 87 shown disposed in each P-body region 86 of FIG. 4 may alternatively be replaced by a single N+ region that extends across the full width of region 86 adjacent to source electrode 92. In this case, the P-body region may be connected to the source electrode at various points (dimensionally into the page of the figure.) In one embodiment, source electrode 92 may protrude through N+ source 87 to contact the underlying P-body region 86 (see FIG. 5K).

The trench gate structure of the embodiment of FIG. 4 potentially offers an advantage of a simplified manufacturing process, due to the elimination of the T-shaped semiconductor regions shown in FIG. 1. Also, the vertical HVNMOS structure of transistor 80 may provide lower on-resistance due to the elimination of the JFET structure formed between the P-body regions.

FIGS. 5A–5K illustrate the various processing steps that may be employed to fabricate a vertical high-voltage transistor in accordance with the present invention. The described fabrication method may be used not only to form the device of FIG. 5K, but also the vertical device structure shown in FIG. 4.

Figure 5A:
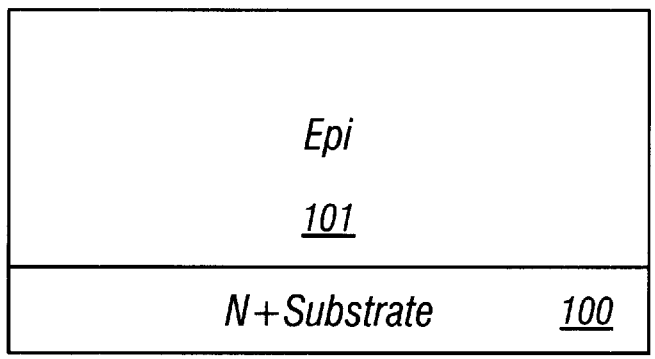
FIGS. 5A–5K are cross-sectional side views of a vertical HVFET device structure taken at various stages in a fabrication process in accordance with yet another embodiment of the present invention.

FIG. 5A shows a vertical high-voltage transistor after the initial processing step of forming an epitaxial layer 101 of n-type semiconductor material on an N+ substrate 100. To support applied voltages in the range of 200V to 1000V the device structure should have an epitaxial layer that is about 15 um to 120 um thick. By way of example, the epitaxial layer of the device shown in FIG. 5 is 40 um thick. The N+ substrate 100 is heavily doped to minimize its resistance to current flowing through to the drain electrode, which is located on the bottom of the substrate in the completed device. Substrate 100 may be thinned, for example, by grinding or etching, and metal may be deposited on its bottom surface to further reduce the on-resistance of the transistor. Most often, these processing steps would be performed after the topside processing has been completed.

The thickness and doping of epitaxial layer 101 largely determine the Vbd of the device. The doping may be carried out as the epitaxial layer is being formed. The optimal doping profile is linearly graded from the drain (at the bottom, adjacent to N+ substrate 100) to the source (at the top). Tailoring the doping concentration so that it is heavier near the substrate 100 results in a more uniform electric-field distribution. Linear grading may stop at some point below the top surface of the epitaxial layer 101. By way of example, for the embodiment shown in FIG. 5 the doping concentration is approximately $2 \times 10^{15}$ cm$^{-3}$ near the P-body region to about $6 \times 10^{16}$ cm$^{-3}$ near the N+ substrate 100.

Figure 5B:
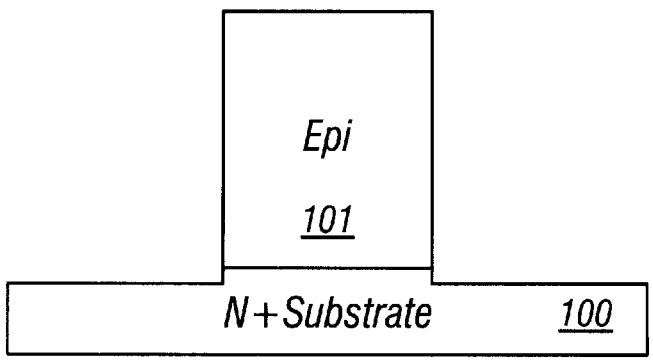

After the epitaxial layer 101 has been formed, the top surface of layer 101 is appropriately masked and deep trenches are then etched into, or alternatively completely through, the epitaxial layer. FIG. 5B shows a cross-sectional view of the device structure following etching of epitaxial layer 101 and part of substrate 100. Note that the lateral width of the etched trenches is determined by the combined thickness of the dielectric and conductive refill layers, as described below.

Spacing between adjacent trenches is determined by the required thickness of the remaining mesa of epitaxial layer material, which, in turn, is governed by the breakdown voltage requirements of the device. It is this mesa of epitaxial material that eventually forms the N-type drift region of the device structure. It should be understood that this mesa of material might extend a considerable lateral distance in an orthogonal direction (into the page). Although the embodiment of FIG. 5 illustrates a device having an extended drain region that comprises a single N-type drift region, it is appreciated that the vertical high-voltage transistor of FIG. 5 may be constructed with a plurality of parallel-arranged N-type drift regions. Ideally, it is desired to make the lateral thickness (i.e., width) of the N-type drift region(s) as narrow as can be reliably manufactured in order to achieve a very high Vbd with a low Rsp. Of course, a larger lateral thickness is easier to manufacture, but the specific on-resistance of the device suffers with a larger lateral thickness since the current is required to flow across a larger silicon area. In one implementation, the thickness is in the approximate range of 0.4 to 1.2 microns. In this example, the thickness of the mesa is about 1 um.

Figure 5C:
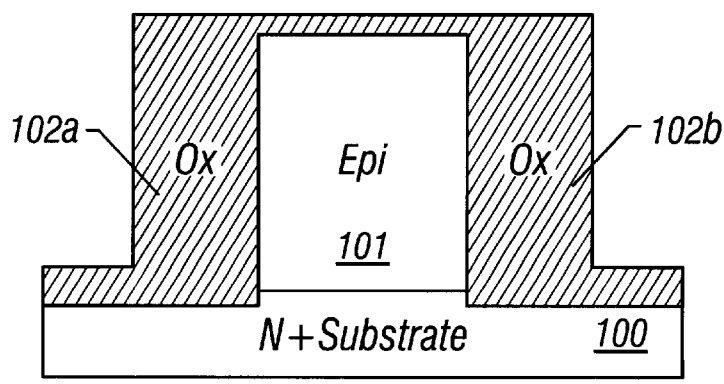

FIG. 5C shows the device structure of FIG. 5B after partial filling of the etched trenches with a dielectric material, e.g., silicon dioxide. As shown, in the embodiment of FIG. 5 oxide region 102a covers one side of etched epitaxial region 101, while oxide region 102b covers the other side of epitaxial region 101. Oxide region 102 also covers the top surface of N+ substrate 100 in each of the trenches.

The dielectric material may be introduced into the trenches using a variety of well-known methods. For instance, regions 102 may be grown thermally, deposited by chemical vapor deposition, and/or spun on in liquid form. For a given lateral thickness of epitaxial layer material 101, the thickness of the dielectric layer may be set to provide a required breakdown voltage, with thicker dielectric layers providing a higher Vbd. However, thicker dielectric layers increase the cell pitch of the transistor structure and result in higher specific on-resistance. In one implementation, the device structure of FIG. 5 has an oxide layer lateral thickness of 4 um. For devices with other $V_{bd}$ performance, this thickness may be in the range of about 2 um–5 um.

Figure 5D:
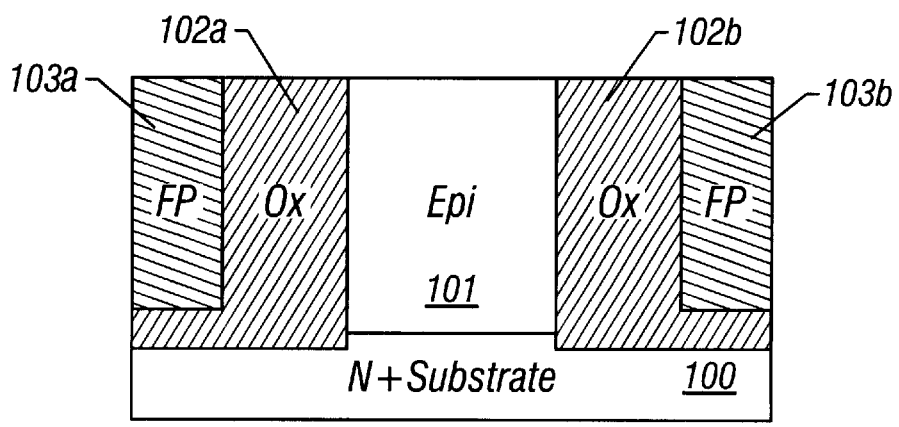

FIG. 5D illustrates the device structure of FIG. 5C following the steps of filling the remaining portions of the trenches with a conductive material and planarizing the surface to form field plate regions 103. For example, the conductive material may comprise a heavily doped polysilicon, a metal (or metal alloys), and/or silicide. Conductor regions 103a and 103b form the field plate members of the device. In most cases, field plate members 103a and 103b should be made as narrow as can be reliably manufactured, since the field plate members occupy silicon area without directly contributing to device conductivity or breakdown voltage characteristics. In one embodiment, the lateral thickness of field plate members 103 is approximately 0.5 um–1.0 um. The planarization of the surface may be performed by conventional techniques such as chemical-mechanical polishing.

At this point in the process, fabrication of the extended drain region of the device is essentially complete. The remaining processing steps may be adapted to produce a stand-alone, high-voltage, depletion-mode MOSFET device structure (as shown in FIG. 5G and FIG. 6) or a high-voltage FET that incorporates a low-voltage MOSFET structure (e.g., FIG. 5K), or other high-voltage devices.

Figure 5E:
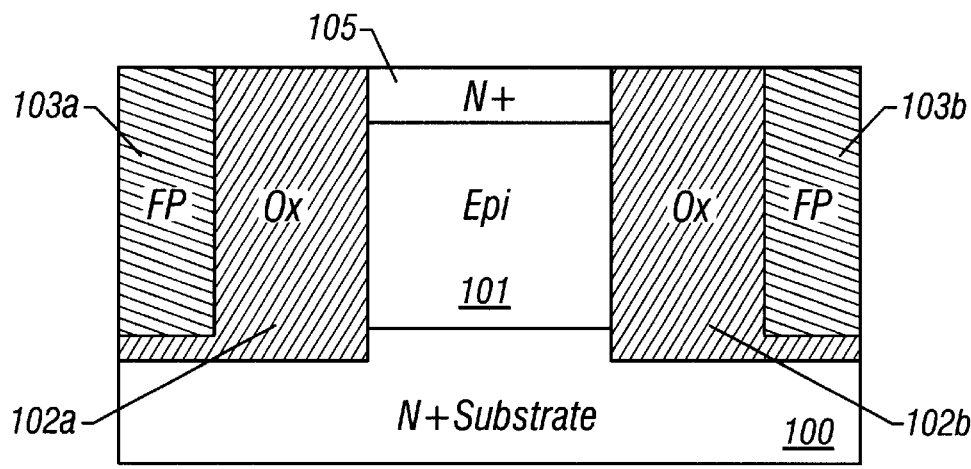

FIG. 5E is a cross-sectional side view of the device structure of FIG. 5D after the introduction of an N+ source region 105 at the top surface of 2, epitaxial layer 101. Source region 105 may be formed using ordinary deposition, diffusion, and/or implantation processing techniques.

After formation of the N+ source region 105 an interlevel dielectric layer 106 is formed over the device. In the embodiment of FIG. 5, interlevel dielectric layer 106 comprises ordinary silicon dioxide that may be deposited and patterned by conventional methods. Openings are formed in dielectric layer 106 and a conductive layer of material (e.g., metal, silicide, etc.) is deposited and patterned to produce the structure shown in FIG. 5F. In this cross-sectional view, source electrode 109 provides electrical connection to N+ source region 105, and electrodes 110a and 110b provide electrical connection to field plate members 103a and 103b, respectively.

Figure 5F:
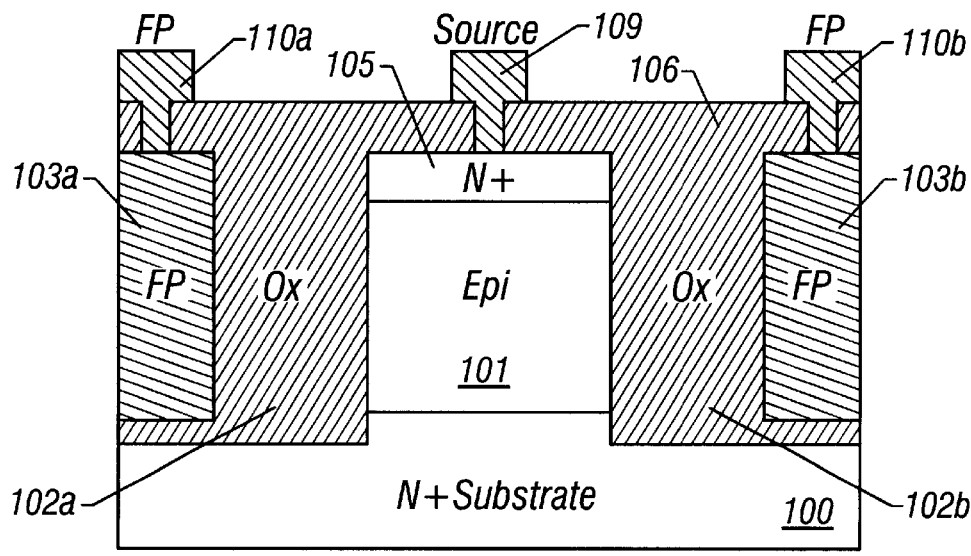
Figure 5G:
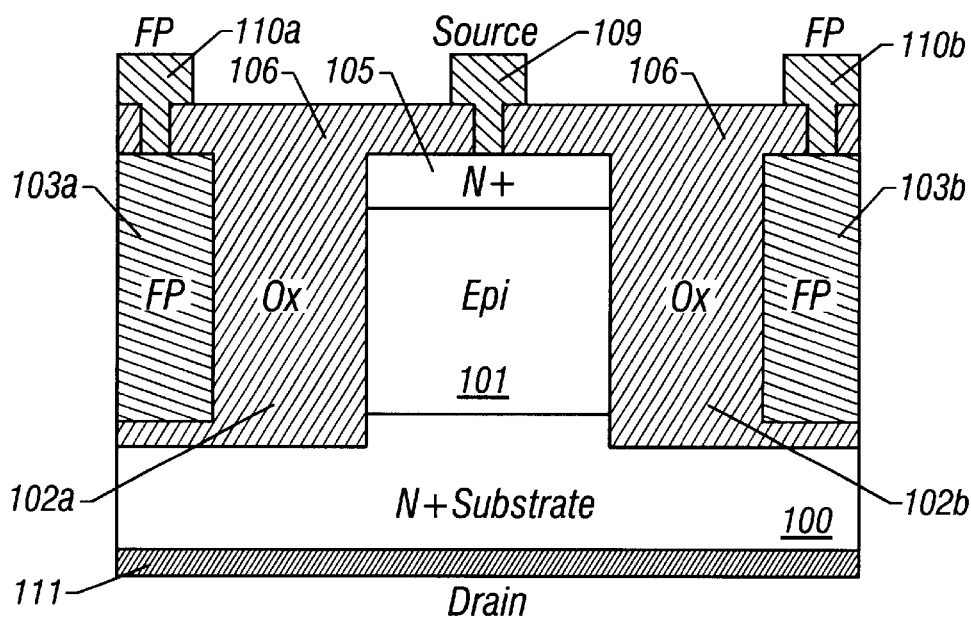
Figure 5H:
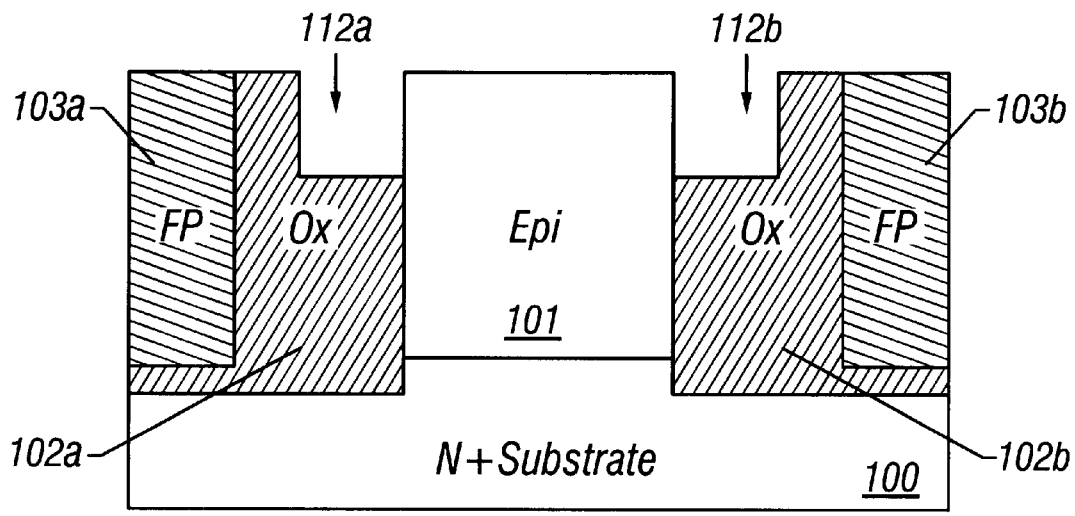
Figure 5I:
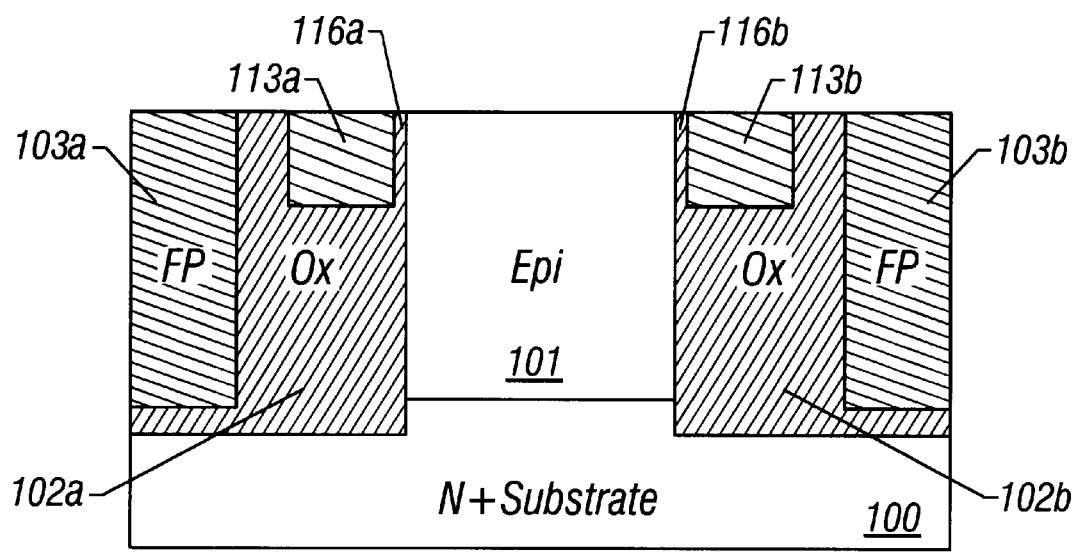
Figure 6:
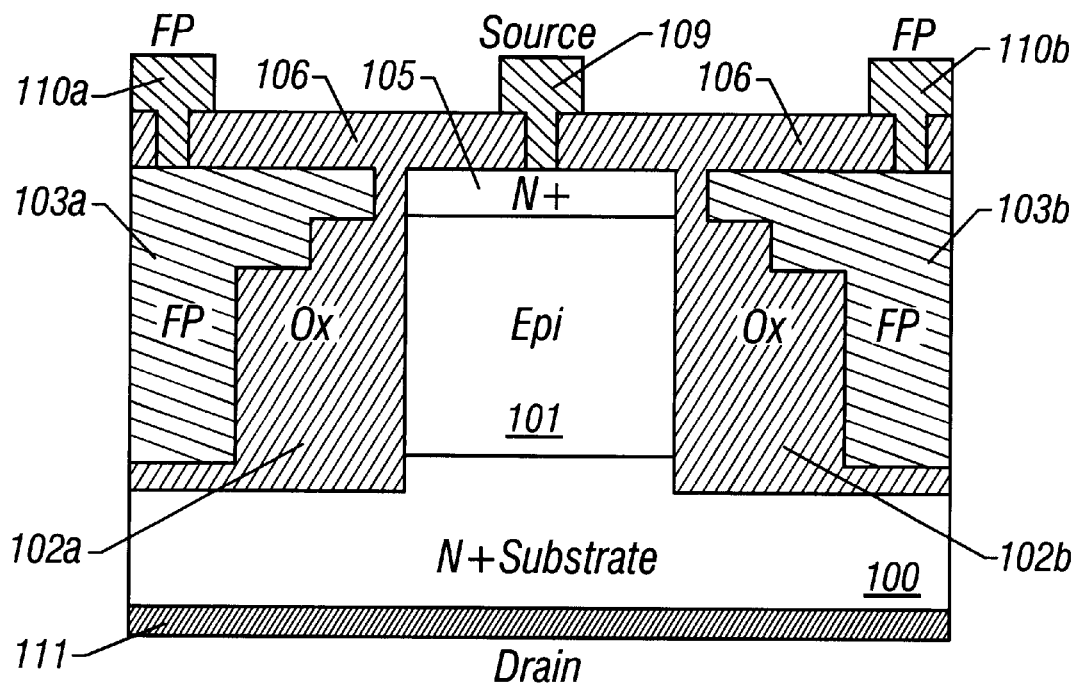
FIG. 6 is a cross-sectional side view of still another embodiment of a vertical HVFET device structure fabricated according to the present invention.

FIG. 5G shows the device structure of FIG. 5F following formation of a drain electrode 111 on the bottom of N+ substrate 100. For example, drain electrode 111 may be formed using the conventional technique of metal sputtering. As described earlier, the bottom of the substrate may first be subjected to grinding, implanting, etc., to lower the drain contact resistance.

The device of FIG. 5G represents a completed high-voltage transistor having a stand-alone drift region; that is, the device of FIG. 5G does not include a low-voltage, series MOSFET structure at the top of the epitaxial layer. Instead, the extended drift region formed by the epitaxial layer, itself, performs the function of the MOSFET without the inclusion of a P-body region. Practitioners in the arts will note that in this device structure current cannot be completely turned-off, since there exists a continuous n-type path for electrons to flow from source electrode 109 to drain electrode 111. Current flow in the device structure of FIG. 5G, however, does saturate when the mesa-like epitaxial layer 101 is pinched-off at high drain voltages.

The device structure of FIG. 6 achieves pinch-off of the extended drain region at lower voltages than the device of FIG. 5G. This is achieved by reducing the spacing between the field plate members 103 and epitaxial layer 101 near the top of the N-type drift region, thereby increasing the capacitance to pinch-off the vertical drift region at a relatively low voltage. FIG. 6 shows a multi-tiered field plate structure extending laterally into oxide regions 102a & 102b to control the pinch-off voltage and, therefore, the saturation current. Alternatively, the field plate members may comprise a single step, a linearly graded lateral extension, or some other profile shape designed to achieve the same result.

Those skilled in the arts will appreciated that for certain circuit applications it may be advantageous to utilize the stand-alone transistor structure of FIG. 5G (or FIG. 6) in series with an ordinary external, low-voltage switching MOSFET. In such an application the low-voltage (e.g., 40V) MOSFET could be used for switching purposes in order to completely turn off current flow in the high-voltage (e.g., 700V) transistor device.

Referring now to FIGS. 5H–5K, there is shown an alternative processing sequence that may be used to fabricate a vertical HVNMOS transistor that includes an insulated gate MOS structure.

Trenches 112a and 112b are formed in respective dielectric layers 102a and 102b on opposite sides of epitaxial layer 101 to accommodate the formation of the insulated gate structure. The depth of trenches 112a and 112b extends from the surface of N+ source region 105 to a depth governed by the intended MOSFET channel length and field plating considerations. In this example, the trench depth is about 1–5 um. By way of example, trenches 112 may be formed by appropriate application of a patterned masking layer to the semiconductor substrate followed by conventional dry or wet etching techniques into oxide layer 102.

Figure 5J:
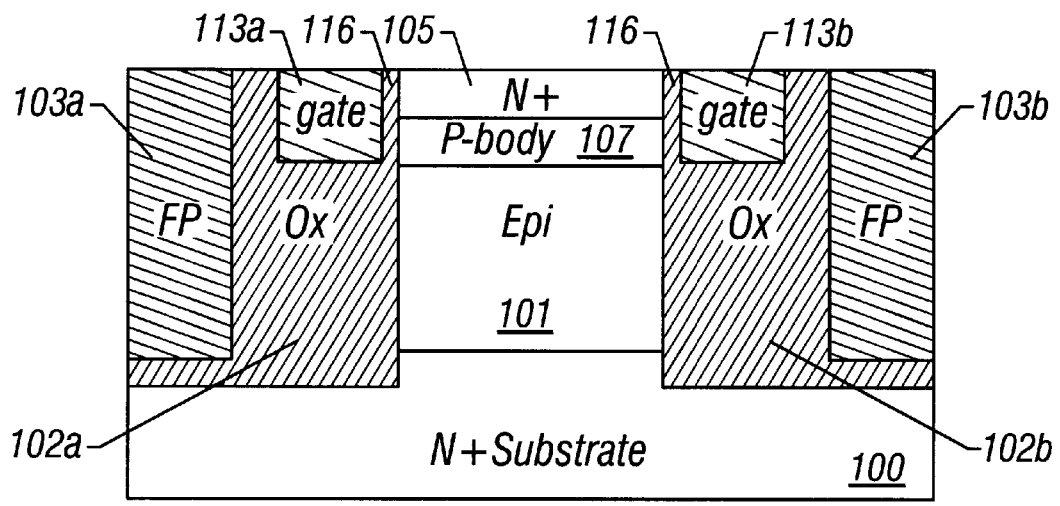

FIG. 5J shows the device after formation of gate dielectric layers 116 and gate members 113 within trenches 112. The gate dielectric layers 116a & 116b may be formed by growing or depositing oxide on the sidewalls of the stacked N+ source, P-body, and epitaxial regions. The device threshold voltage determines the thickness of layers 116. In one embodiment, layers 116 comprise silicon dioxide having a thickness on the order of 250–1000 angstroms.

In the embodiment shown, a portion of dielectric layers 102 isolates field plate members 103 from gate members 113. Alternatively, trenches 112 may expose the top portion of field plate 103 and the same processing steps used to create layers 116 may also be used to form dielectric layers on the sidewalls of the field plates to isolate the field plates from the gate members.

Once dielectric layers 116 have been formed on the sidewalls of trenches 112, a conductive material, such as doped polysilicon, may be deposited to fill the remaining portions of the trenches. In this implementation, the doped polysilicon forms the gate members 113a and 113b of the MOS transistor structure. FIG. 5J shows the device after introduction of a P-body region 107 and a N+ source region 105 at the top surface of epitaxial region 101. Regions 107 and 105 may be formed using standard implantation, deposition, and/or thermal diffusion processing steps. In the completed device, application of a sufficient voltage to gate members 113 causes a conductive channel to be formed along the sidewall portions of P-body region 107 between N+ source region 105 and epitaxial region 101. The channel length is therefore determined by the thickness of P-body region 107, which, for the particular embodiment shown, may be approximately 0.5 um–3.0 um, with the N+ source region 105 in the range of about 0.1–0.5 um. A shorter channel length results in a lower channel resistance, which likewise reduces the on-resistance of the device. It should be understood, however, that a too short channel would cause punch-through problems.

Figure 5K:
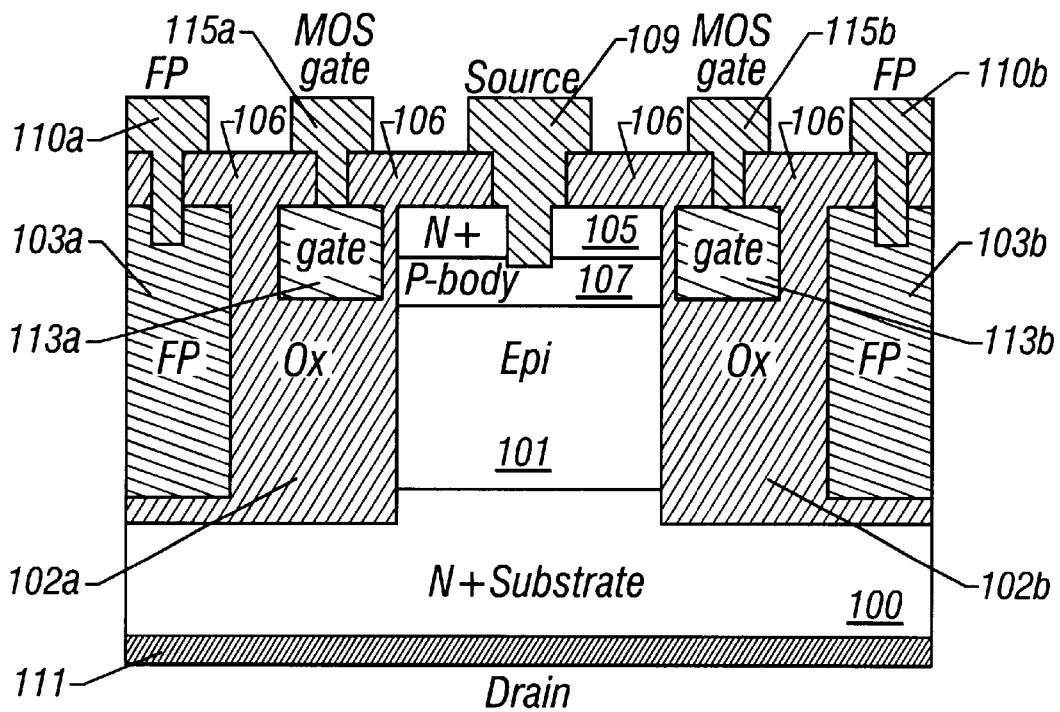

FIG. 5K shows the completed HVFET device structure following formation of an interlevel dielectric layer 106 (e.g., silicon dioxide, silicon nitride, etc.). This layer may be deposited and patterned to form contact openings. In the embodiment shown, the etching of layer 106 is followed by etching of the field plates, gate members, N+ and P-body regions. This is followed by deposition and patterning of a conductive layer (e.g., metal, silicide, etc.) to create source electrode 109, gate electrodes 115, and field plate electrodes 110, which provide electrical connection to the respective regions of the device. The optional etching step described above allows the source electrode to contact the P-body region without patterning the N+ source region, thus simplifying the process. A conductive layer may also be applied to the bottom of substrate 100 (after optional treatment by grinding, etching, implanting, etc.) to form the drain electrode 111.

Note that while source electrode 109 is shown extending down to P-body 107 in the cross-sectional view of FIG. 5K, in other embodiments electrode may only extend to the upper surface of source region 105. It should also be appreciated that electrode 109 does not separate region 105 into two separate source regions in the illustration of FIG. 5K. Rather, electrode 109 is fabricated in the form of a plug that is surrounded by N+ material that comprises region 105.

We claim:

1. A lateral high-voltage transistor fabricated on a substrate comprising:
    an insulating layer that covers a top surface of the substrate;
    a drain region of a first conductivity type disposed above the insulating layer;
    a body region of a second conductivity type opposite to the first conductivity type disposed above the insulating layer;
    a plurality of parallel-arranged drift regions of the first conductivity type disposed above the insulating layer, each of the drift regions extending in a first direction from the drain region to the body region, adjacent ones of the drift regions being separated in a second direction orthogonal to the first direction by a dielectric layer;
    a field plate member disposed within each dielectric layer, the field plate member being fully insulated from the drift regions;
    a source region of the first conductivity type that adjoins the body region and is spaced-apart from the drift regions; and
    an insulated gate member disposed adjacent to the body region, with a channel region being defined in the body region adjacent the insulated gate member between the source region and at least one of the drift regions.

2. The lateral high-voltage transistor according to claim 1 wherein the second direction is oriented perpendicular to a bottom surface of the substrate.

3. The lateral high-voltage transistor according to claim 2 wherein the substrate comprises a bottom field plate member.

4. The lateral high-voltage transistor according to claim 1 wherein the second direction and is oriented substantially parallel to a bottom surface of the substrate.

5. The lateral high-voltage transistor according to claim 4 wherein each of the drift regions also extends in a vertical direction to the insulating layer.

6. The lateral high-voltage transistor according to claim 1 further comprising:
    a drain electrode electrically connected to the drain region;
    a source electrode electrically connected to the source region.

7. The lateral high-voltage transistor according to claim 6 wherein the drain region extends in a vertical direction from the insulating layer to the drain electrode.

8. The lateral high-voltage transistor according to claim 1 wherein the first conductivity type is n-type and the second conductivity type is p-type.

9. The lateral high-voltage transistor according to claim 1 wherein the source region is disposed above the body region.

10. The lateral high-voltage transistor according to claim 9 further comprising a gate electrode electrically connected to the insulated gate member.

11. The lateral high-voltage transistor according to claim 1 wherein the source region is disposed in the body region.

12. The lateral high-voltage transistor according to claim 11 wherein the channel region extends substantially parallel to the top surface of the substrate.

13. A lateral high-voltage transistor fabricated on a substrate comprising:
    a drain region of a first conductivity type;
    at least one source region of the first conductivity type;
    a plurality of drift regions of the first conductivity type arranged substantially in parallel and extending in a first direction from the drain region to the at least one source region, adjacent ones of the drift regions being separated in a second direction substantially orthogonal to the first direction by a dielectric layer, the first direction being oriented substantially parallel to a bottom surface of the substrate and the second direction being oriented substantially perpendicular to the bottom surface;
    at least one field plate member disposed within the dielectric layer, the at least one field plate member being fully insulated from the drift regions.

14. The lateral high-voltage transistor according to claim 13 further comprising:
    source electrode electrically connected to the at least one source region; and
    a drain electrode electrically connected to the drain region.

15. The lateral high-voltage transistor according to claim 13 wherein the lateral high-voltage transistor is fabricated on a semiconductor substrate having a planar bottom surface, the first direction being oriented parallel to the planar bottom surface and the second direction being oriented perpendicular to the planar bottom surface.

16. The lateral high-voltage transistor according to claim 13 wherein the high-voltage transistor is fabricated on a semiconductor substrate having a planar bottom surface, the first and second directions being oriented substantially parallel to the planar bottom surface.

17. The lateral high-voltage transistor according to claim 13 wherein the first conductivity type comprises n-type and the second conductivity type comprises p-type.

18. The lateral high-voltage transistor according to claim 13 wherein the at least one field plate member is electrically isolated from the drain region.

19. The lateral high-voltage transistor according to claim 13 wherein the at least one field plate member comprises a conductive material.

20. A lateral high-voltage transistor, comprising:
    a drain region of a first conductivity type;
    a body region of a second conductivity type opposite to the first conductivity type;
    a source region of the first conductivity type;
    first and second drift regions of the first conductivity type arranged substantially in parallel and extending in a first direction from the drain region to the body region, the source region being separated from the drift regions by the body region, the first and second drift regions being separated in a second direction substantially orthogonal to the first direction by a first dielectric layer;

a first field plate member disposed within the dielectric layer, the first field plate member being fully insulated from the drift regions and arranged substantially parallel to the first and second drift regions such that the first field plate member is spaced-apart from each of the first and second drift regions by a separation distance, the first and second drift regions each having a width in the second direction that is less than or equal to the separation distance.

21. The lateral high-voltage transistor according to claim 20 further comprising:

a second dielectric layer;

a second field plate member separated from the second drift region by the second dielectric layer.

22. The lateral high-voltage transistor according to claim 21 further comprising:

a third dielectric layer;

a third field plate member separated from the first drift region by the third dielectric layer.

23. The lateral high-voltage transistor according to claim 22 wherein the third field plate member comprises a semiconductor substrate.

24. The lateral high-voltage transistor according to claim 23 wherein the first, second and third dielectric layers each comprise silicon dioxide.

25. The lateral high-voltage transistor according to claim 20 further comprising:

a source electrode electrically connected to the source region; and a drain electrode electrically connected to the drain region.

26. The lateral high-voltage transistor according to claim 20 wherein the lateral high-voltage transistor is fabricated on a semiconductor substrate having a substantially planar bottom surface, the first direction being oriented substantially parallel to the bottom surface and the second direction being oriented substantially perpendicular to the bottom surface.

27. The lateral high-voltage transistor according to claim 20 wherein the high-voltage transistor is fabricated on a semiconductor substrate having a substantially planar bottom surface, the first and second directions being oriented substantially parallel to the bottom surface.

28. The lateral high-voltage transistor according to claim 20 wherein the first conductivity type comprises n-type and the second conductivity type comprises p-type.

29. A lateral high-voltage transistor fabricated on a substrate comprising:

a drain region of a first conductivity type;

a body region of a second conductivity type opposite to the first conductivity type;

at least one source region of the first conductivity type;

a plurality of drift regions of the first conductivity type arranged substantially in parallel and extending in a first direction from the drain region to the body region, the at least one source region being separated from the drift regions by the body region, adjacent ones of the drift regions being separated in a second direction substantially orthogonal to the first direction by a dielectric layer, the first direction being oriented substantially parallel to a bottom surface of the substrate and the second direction being oriented substantially perpendicular to the bottom surface;

at least one field plate member disposed within the dielectric layer, the at least one field plate member being fully insulated from the drift regions.

30. The lateral high-voltage transistor according to claim 29 wherein the at least one field plate member comprises a conductive material that is electrically isolated from the drain region.

31. The lateral high-voltage transistor according to claim 29 wherein the first conductivity type is n-type and the second conductivity type is p-type.

32. A lateral high-voltage transistor fabricated on a substrate comprising:

an insulating layer that covers a top surface of the substrate such that the substrate functions as a bottom field plate member;

a drain region of a first conductivity type disposed above the insulating layer;

a body region of a second conductivity type opposite to the first conductivity type disposed above the insulating layer;

a plurality of drift regions of the first conductivity type arranged substantially in parallel and disposed above the insulating layer, each of the drift regions extending in a first direction from the drain region to the body region, adjacent ones of the drift regions being separated in a second direction substantially orthogonal to the first direction by a dielectric layer;

a field plate member disposed within each dielectric layer, the field plate member being fully insulated from the drift regions;

a source region of the first conductivity type that adjoins the body region and is spaced-apart from the drift regions; and an insulated gate member disposed adjacent to the body region, with a channel region being defined in the body region adjacent the insulated gate member between the source region and at least one of the drift regions.

33. The lateral high-voltage transistor according to claim 32 wherein the second direction is oriented substantially perpendicular to a bottom surface of the substrate.

34. The lateral high-voltage transistor according to claim 33 wherein the field plate member comprises a conductive material.

35. The lateral high-voltage transistor according to claim 34 further comprising:

a drain electrode electrically connected to the drain region and electrically isolated from the field plate member;

a source electrode electrically connected to the source region.

36. The lateral high-voltage transistor according to claim 35 wherein the drain region extends in a vertical direction from the insulating layer to the drain electrode.

37. The lateral high-voltage transistor according to claim 32 wherein the second direction is oriented substantially parallel to a bottom surface of the substrate.

38. The lateral high-voltage transistor according to claim 37 wherein each of the drift regions also extends in a vertical direction to the insulating layer.

39. The lateral high-voltage transistor according to claim 32 wherein the first conductivity type is n-type and second conductivity type is p-type.

40. The lateral high-voltage transistor according to claim 32 wherein the source region is disposed above the body region.

41. The lateral high-voltage transistor according to claim 32 wherein the source region is disposed in the body region.

42. A lateral high-voltage transistor comprising:
a drain region of a first conductivity type;
a body region of a second conductivity type opposite to the first conductivity type;
at least one source region of the first conductivity type;
a plurality of drift regions of the first conductivity type arranged substantially in parallel and extending in a first direction from the drain region to the body region, the at least one source region being separated from the drift regions by the body region, adjacent ones of the drift regions being separated in a second direction substantially orthogonal to the first direction by a dielectric layer;
at least one field plate member disposed within the dielectric layer, the at least one field plate member being fully insulated from the drift regions and electrically Isolated from the drain region.

43. The lateral high-voltage transistor according to claim 42 wherein the at least one field plate member comprises a conductive material.

44. The lateral high-voltage transistor according to claim 42 wherein the lateral high-voltage transistor is fabricated on a semiconductor substrate having a bottom surface, the first direction being oriented substantially parallel to the bottom surface and the second direction being oriented substantially perpendicular to the bottom surface.

45. The lateral high-voltage transistor according to claim 42 wherein the high-voltage transistor is fabricated on a semiconductor substrate having a bottom surface, the first and second directions being oriented substantially parallel to the bottom surface.

46. The lateral high-voltage transistor according to claim 42 wherein the first conductivity type comprises n-type and the second conductivity type comprises p-type.

47. A lateral high-voltage transistor comprising:
a drain region of a first conductivity type;
at least one source region of the first conductivity type;
a plurality of drift regions of the first conductivity type arranged substantially in parallel and extending in a first direction from the drain region to the at least one source region, adjacent ones of the drift regions being separated in a second direction substantially orthogonal to the first direction by a dielectric layer;
at least one field plate member disposed within the dielectric layer, the at least one field plate member being fully insulated from the drift regions and arranged substantially parallel to the first and second drift regions such that the first field plate member is spaced-apart from each of the drift regions by a separation distance, each of the drift regions having a width in the second direction that is less than or equal to the separation distance.

48. The lateral high-voltage transistor according to claim 47 further comprising:
a source electrode electrically connected to the source region; and
a drain electrode electrically connected to the drain region.

49. The lateral high-voltage transistor according to claim 47 wherein the lateral high-voltage transistor is fabricated on a semiconductor substrate having a bottom surface, the first direction being oriented substantially parallel to the bottom surface and the second direction being oriented substantially perpendicular to the bottom surface.

50. The lateral high-voltage transistor according to claim 47 wherein the lateral high-voltage transistor is fabricated on a semiconductor substrate having a bottom surface, the first and second directions being oriented substantially parallel to the bottom surface.

51. The lateral high-voltage transistor according to claim 47 wherein the first conductivity type comprises n-type and the second conductivity type comprises p-type.

52. A lateral high-voltage transistor comprising:
a drain region of a first conductivity type
a body region of a second conductivity type opposite to the first conductivity type;
at least one source region of the first conductivity type;
a plurality of drift regions of the first conductivity type arranged substantially in parallel and extending in a first direction from the drain region to the body region, the at least one source region being separated from the drift regions by the body region, adjacent ones of the drift regions being separated in a second direction substantially orthogonal to the first direction by a dielectric layer;
at least one field plate member of a conductive material disposed within the dielectric layer, the at least one field plate member being fully insulated from the drift regions.

53. The lateral high-voltage transistor according to claim 52 wherein the at least one field plate member is electrically isolated from the drain region.

54. The lateral high-voltage transistor according to claim 52 wherein the lateral high-voltage transistor is fabricated on a substrate having a bottom surface, the first direction being oriented substantially parallel to the bottom surface and the second direction being oriented substantially perpendicular to the bottom surface.

55. The lateral high-voltage transistor according to claim 52 wherein the high-voltage transistor is fabricated on a substrate having a bottom surface, the first and second directions being oriented substantially parallel to the bottom surface.

56. The lateral high-voltage transistor according to claim 52 wherein the first conductivity type comprises n-type and the second conductivity type comprises p-type.

* * * * *